(12) United States Patent
Winkler et al.

(10) Patent No.: US 10,801,705 B2
(45) Date of Patent: Oct. 13, 2020

(54) LED LIGHT EMITTING STRIP AND ARRANGEMENT OF LED LIGHT EMITTING STRIPS

(71) Applicant: vosla GmbH, Plauen (DE)

(72) Inventors: Markus Winkler, Tauerbischofsheim (DE); Matthias Bottcher, Wohlhausen (DE); Martin Enenkel, Marrkleeberg (DE)

(73) Assignee: VOSLA GMBH, Plauen (DE)

( * ) Notice: Subject to any disclaimer, the term of this patent is extended or adjusted under 35 U.S.C. 154(b) by 828 days.

(21) Appl. No.: 14/996,429

(22) Filed: Jan. 15, 2016

(65) Prior Publication Data

US 2017/0205057 A1 Jul. 20, 2017

(51) Int. Cl.
| | |
|---|---|
| *F21V 21/005* | (2006.01) |
| *F21S 43/19* | (2018.01) |
| *F21S 43/14* | (2018.01) |
| *F21S 43/15* | (2018.01) |
| *H01L 25/075* | (2006.01) |

(Continued)

(52) U.S. Cl.
CPC ............ *F21V 21/005* (2013.01); *F21S 43/14* (2018.01); *F21S 43/15* (2018.01); *F21S 43/19* (2018.01); *F21S 43/195* (2018.01); *F21S 2/00* (2013.01); *F21S 4/20* (2016.01); *F21V 23/06* (2013.01); *F21Y 2103/10* (2016.08); *F21Y 2115/10* (2016.08); *H01L 25/0753* (2013.01); *H01L 33/62* (2013.01); *H05K 3/365* (2013.01)

(58) Field of Classification Search
CPC ........ F21V 21/005; F21V 23/06; F21S 41/00; F21S 4/20; F21S 2/00; F21S 43/14; F21S 43/19; F21S 43/15; F21S 43/195; F21Y 2103/10; F21Y 2115/10; H01L 25/0753; H01L 33/62; H05K 3/365
USPC ..................................... 362/217.17
See application file for complete search history.

(56) References Cited

U.S. PATENT DOCUMENTS

| | | | |
|---|---|---|---|
| 9,239,136 B1 * | 1/2016 | Petersen | ............... H01R 13/62 |
| 2008/0101070 A1 | 5/2008 | Chou | |

(Continued)

FOREIGN PATENT DOCUMENTS

DE 20 2014 001 943 U1 5/2014

OTHER PUBLICATIONS

Extended European search report for European Patent Application No. 16202166.1, dated Feb. 13, 2017, 7 pages.

*Primary Examiner* — Cara E Rakowski
*Assistant Examiner* — Jessica M Apenteng
(74) *Attorney, Agent, or Firm* — Westman, Champlin & Koehler, P.A.

(57) ABSTRACT

The present invention provides a LED light emitting strip, comprising: a substrate extending along a length direction of the strip; a plurality of LED chips arranged on or in the substrate, wherein the LED chips are arranged in at least one row along the length direction; at least two contact stripes configured to supply the LED chips with electric energy, wherein each of the contact stripes individually extends, at least partially, along a side of the substrate in the length direction, and wherein the LED chips are contacted to the contact stripes at least partially in a transverse or oblique direction of the strip. The present invention further provides an arrangement of light emitting strips including such a LED light emitting strip and a method of manufacturing such an arrangement.

22 Claims, 3 Drawing Sheets

(51) Int. Cl.
  *H05K 3/36* (2006.01)
  *H01L 33/62* (2010.01)
  *F21S 2/00* (2016.01)
  *F21S 4/20* (2016.01)
  *F21Y 103/10* (2016.01)
  *F21Y 115/10* (2016.01)
  *F21V 23/06* (2006.01)

(56) References Cited

U.S. PATENT DOCUMENTS

2010/0008090 A1* 1/2010 Li ................... F21V 17/007
  362/249.03
2011/0309379 A1* 12/2011 Shibusawa ............ F21K 9/00
  257/88
2013/0058080 A1   3/2013 Ge et al.
2013/0229815 A1   9/2013 Pfeil \* cited by examiner

LED LIGHT EMITTING STRIP AND ARRANGEMENT OF LED LIGHT EMITTING STRIPS

FIELD OF THE INVENTION

The present invention relates to a LED light emitting strip and to an arrangement of LED light emitting strips. The present invention also relates to a method of manufacturing such an arrangement of LED light emitting strips and to an automotive lighting system that includes such a LED light emitting strip or arrangement of LED light emitting strips.

BACKGROUND OF THE INVENTION

An LED (light emitting diode) light emitting trip usually comprises a row of LED chips, which are usually embedded in a transparent encapsulant and contacted in series from one end of the LED strip to the other. Such an LED strip is described for example in US 2013/0058080 A1.

In lighting systems, especially in automotive lighting systems, comprising one or more LED light emitting strips, a number of LED strips is usually arranged next to each other but not connected. Transitions between the strips are usually avoided, because a connection between such LED light emitting strips is visible as a dark area when the LEDs are lighted.

Therefore, a conventional approach for automotive LED light emitting strips comprises a light guiding element formed as a strip, in which light of an LED is distributed. Such a strip is described in US 2013/0229815 A1. This kind of LED lighted strips, however, is limited in design. On one hand, there is a limitation regarding a necessary minimum diameter of the light guiding element, which is needed to couple a desired amount of light into the light guiding element. On the other hand, a minimum bending radius or curvature of the light guiding element is limited since guiding properties in such light guiding elements are based on the principle of total reflection. The necessary minimum bending radius or curvature is needed to totally reflect the light in the light guiding element, which otherwise would be coupled out.

SUMMARY OF THE INVENTION

In view of the above, an object of the present invention is to provide a new and improved LED light emitting strip, in particular for an automotive lighting system, and an arrangement of such LED light emitting strips. The present invention also relates to a method of manufacturing such an arrangement of LED light emitting strips and to an automotive lighting system that includes such a LED light emitting strip or arrangement of LED light emitting strips.

In accordance with the present invention, an LED light emitting strip as recited in claim 1, an arrangement of LED light emitting strips as recited in claim 15 or as recited in claim 12, a method of manufacturing an arrangement of LED light emitting strips as recited in claim 19 and an automotive lighting system as recited in claim 17 are provided. Advantageous or preferred features of the invention are recited in the dependent claims.

According to one aspect, therefore, the present invention provides a LED light emitting strip, in particular for an automotive lighting system, comprising: a substrate extending along a length direction of the strip; a plurality of LED chips arranged on or in the substrate, wherein the LED chips are arranged in at least one row along the length direction; at least two contact stripes configured to supply the LED chips with electric energy, wherein each of the contact stripes individually extends, at least partially, along a side of the substrate in the length direction, and wherein the LED chips are contacted to the contact stripes at least partially in a transverse or oblique direction of the strip.

In this way, the invention provides an LED light emitting strip which is configured for providing connections or transitions between LED light emitting strips, which are invisible from outside when the LED light emitting strips are lighted, in particular without any need for a light guiding element.

This is realized in that the contact stripes, which are isolated from each other and individually extend along a side (longitudinal side) of the substrate in length direction, allow a free configuration of a distance between a last LED chip in the row on or in the substrate and an end of the LED light emitting strip. In particular, according to the invention, there is no need for a contact at an end face of the substrate. In this way, the distance between the last LED of a first end of a LED light emitting strip and a first LED of a second end of a LED light emitting strip, which first and second ends are to be connected, can be adapted to the distance between two LED chips in a row of the LED light emitting strip.

The first and second ends, which are to be connected, may belong to different LED light emitting strips, e.g. connected to each other in a butt configuration. However, the first and second ends may also belong to the same LED light emitting strip, which in this case is circuitously formed or comprises an otherwise formed closed shape.

The LED light emitting strip of the invention allows new ways of lighting design, in particular in the field of automotive lighting, since an LED light emitting strip of the invention is much smaller in its diameter compared to conventional automotive light emitting strips including light guiding elements. In particular, contact stripes can be designed very thin. Thus, the size of a minimum diameter of a light emitting strip according to the invention even may be in the scale of the size of the LED chips.

Furthermore, The LED light emitting strip of the invention allows any desired bending radius or curvature. Additionally, since there is neither any need for a light guiding element nor any need to contact the LED chips in series, there is no limitation for the length of an LED light emitting strip according to the invention, even with a completely straight forms of the strip. In contrast, according to the present invention, any length of a LED light emitting strip can be realized, in particular with a similar density of LED chips and light emission.

Furthermore, according to the present invention, closed geometries of a LED light emitting strip can be easily realized just by connecting the two ends of the light emitting strip, in particular without any need for further measures.

The substrate preferably forms a structural basis of the LED light emitting strip. In particular for automotive applications, the substrate does not necessarily have to be transparent. It may be even desirable for automotive applications to direct the light emitted from the LED chips at a defined radiation angle smaller than 180°.

The LED chips on or in the substrate are preferably fixed to the substrate or embedded therein. The at least one row of LED chips along the length direction preferably is configured as a regular row, in particular with equal distances between the LED chips.

The contact stripes may be connected or fixed to the substrate or integrally formed therewith. In particular, the contact stripes may be arranged on opposite sides of the substrate.

The contacts of the LED chips may be formed, for example, as wirebonds or conductor paths. They can be fixed to the LED chips and contact strips and/or fixed to or embedded in the substrate. The position of the contacts can be advantageously adapted to any special requirements, since the contact stripes provide for various arrangements of the contacts.

In a preferred embodiment a surface of the substrate is configured with a high reflectance. In this way, the substrate functions as a reflector to direct light emitted from the LEDs to a desired direction. Therefore, the LED light emitting strip according to the invention is particularly suitable for automotive lighting systems.

In another preferred embodiment, the substrate is configured plastically deformable. In this way, the LED light emitting strip can be freely formed or shaped in the manufacturing process in a very flexible way and afterwards keeps the form or shape. The LED light emitting strip thus can be used for various different applications, in particular in the interior and/or exterior of a vehicle. In particular, a plastically deformable material of the substrate has a ductility sufficient for forming the LED light emitting strip in the manufacturing process of a lighting system in a desired way, without any cracks or damage of the substrate.

According to a preferred embodiment, the substrate comprises a metal. Therefore, on one hand, the material of the substrate can be selected to be plastically deformable in a desired way. On the other hand, the material of the substrate thus can be selected to have a high thermal conductivity for improved thermal management and/or an equal temperature distribution along the length direction of the LED light emitting strip.

According to another preferred embodiment, the substrate is formed integral with at least one of the contact stripes. Accordingly, the substrate may be configured as one of the at least two contact stripes. Furthermore, the substrate may connect multiple terminals or multiple contact stripes of the same polarity. In this case, an isolation is provided between the substrate and any contact stripe of opposite polarity. With such an integral design, the number of parts can be advantageously reduced. Reduction of parts, in turn, facilitates the manufacturing of the LED light emitting strip.

According to another preferred embodiment, the at least two contact stripes each comprise a plurality of terminals for additionally applying supply voltage to the LED chips. In particular, each contact stripe comprises at least two terminals. The terminals are distributed along the contact stripe and apply supply voltage at different parts or sections thereof. In this way, a decrease of voltage over the length of the contact stripe, which otherwise, in particular in very long LED light emitting strings, can arise through resistance heating, is avoided. Furthermore functional reliability is improved, since the terminals form redundant supplies for the contact stripes.

According to another preferred embodiment, a first terminal of a respective contact stripe is arranged at a section of the contact stripe distinct from the section of a second terminal. In this way, different sections of the contact stripe are each directly supplied with voltage. The section of the first terminal may be connected to the section of the second terminal via the respective contact stripe. Alternatively, the sections may be isolated from each other.

According to another preferred embodiment, the at least one of the contact stripes is configured for mating or joining the light emitting strip with another light emitting strip. In this way, the contact stripe additionally serves as a mechanical connecting element for connecting two light emitting strips. The contact stripe therefore combines multiple functions of supplying the LED chips of a LED light emitting strip with electric energy and of mechanically connecting the LED light emitting strips in one part or element. In case of an integrated design of the contact stripe with a substrate, preferably a reflective and/or metallic substrate as described above, even more functions may be combined in this one part or element.

According to another preferred embodiment, an end of at least one of the contact stripes is formed female or socket shaped. The end of the at least one of the contact stripes is configured to accommodate an end of the other light emitting strip.

Alternatively or in addition, the end of the at least one of the contact stripes is configured to accommodate an end of at least one of the contact stripes of the other light emitting strip. The female or socket shaped end may thereby be formed with the contact stripes and the substrate.

In particular, the female or socket shaped end of the at least one of the contact stripes extends over the corresponding end of the light emitting strip, in particular at least over the corresponding end of the substrate. In this way, the light emitting strips can be easily connected to each other by sticking, plugging or inserting the end of the other light emitting strip, in particular an end of the substrate thereof, into the female or socket shaped end. Alternatively or in addition, the light emitting strips can be easily connected to each other by sticking, plugging or inserting the end of at least one of the contact stripes of the other light emitting strip into the female or socket shaped end.

According to another preferred embodiment, the LED chips of at least one segment of the light emitting strip are contacted with the contact strips in parallel to LED chips of at least one other segment of the light emitting strip. In this way, the segments can be supplied with current/voltage individually and the functional reliability and safety is improved.

According to another preferred embodiment, a plurality of pairs of contact stripes are provided in a row along the length direction such that each pair of contact stripes corresponds to an individual segment of the LED light emitting strip. In this way, each segment of the LED light emitting strip is supplied individually by a pair of contact stripes.

According to another preferred embodiment, the respective pairs of contact stripes are isolated or distanced from each other and each pair of contact stripes is configured to supply LED chips of the corresponding segment of the light emitting strip. In this way, each segment of the LED light emitting strip can be independently supplied with electric energy and therefore lighted independent from the other segments.

According to another preferred embodiment, each pair of contact stripes is configured individually controllable to individually actuate or light the corresponding segment of the light emitting strip. In particular, the segments are configured to be controlled by an external control unit such that they can be individually lighted. Accordingly, the segments of the LED light emitting strip can be specifically lighted in a desired pattern or sequence.

According to another preferred embodiment, the LED chips arranged in the at least one row are positioned apart from each other with a predetermined distance. In this way, a regular outer appearance of the LED string is provided.

According to a further aspect, the present invention provides an arrangement of light emitting strips, comprising: a first light emitting strip and a second light emitting strip, wherein at least one of the first and second light emitting strips is configured as light emitting strip according to the invention, and wherein the first and second light emitting strips are mated or joined with each other.

As discussed above, the invention is configured for providing connections between LED light emitting strips, which are invisible from outside when the LED light emitting strips are lighted. In this way, connections between the two or more LED light emitting strips in an arrangement of such strips are invisible from outside when the LED light emitting strips are lighted.

Two or more LED light emitting strips may be arranged and connected in a butt-configuration or arranged and connected in another possible configuration, for example a configuration in T-form, L-form, V-form, Y-form, X-form, star form, Z-form or the like.

In a preferred embodiment, an end of the first light emitting strip is mated or joined with an end of the second light emitting strip. The first and second light emitting strips may be arranged in a butt-configuration or oriented at any angle to each other.

According to a further aspect, the present invention provides an arrangement of light emitting strips, comprising: a first light emitting strip and a second light emitting strip, wherein at least one of the first and second light emitting strips is configured as light emitting strip according to the invention, wherein the LED chips arranged in the at least one row are positioned apart from each other with a predetermined distance, wherein the predetermined distance between the LED chips arranged in the at least one row is a first distance, wherein the first and second light emitting strips are mated or joined with each other, wherein a second distance between a last LED chip of a row of the first light emitting strip and a first LED chip of a row of the second light emitting strip is provided adapted to the first distance.

As discussed above, the invention is configured for providing connections between LED light emitting strips, which are invisible from outside when the LED light emitting strips are lighted. The length of the second distance can be adapted in that the contact stripes individually extending along a side of the substrate in the length direction allow a free configuration of a distance between a last LED and an end of the LED light emitting strip. In particular, there is no need for a contact at an end face of the substrate. In contrast, a transition between the ends of the LED light emitting strips provides a second distance, which has no or only small deviation from the first distance. The LED light emitting strips thus may be connected to each other, e.g. in a butt configuration, with a connection between the LED light emitting strips invisible or only hardly visible from outside when the LED light emitting strips are lighted.

In a preferred embodiment, a length of the second distance is at least 90% of a length of the first distance.

According to another preferred embodiment, the LED chips have a uniform length, and the second distance is equal to or less than the sum of the first distance and the length of one LED chip. In this way, a difference between the first and second distances is hardly recognizable from outside.

According to another aspect, the invention provides a method of manufacturing an arrangement of light emitting strips, in particular an arrangement of light emitting strips according to the invention, comprising the steps of: positioning a first light emitting strip relative to a second light emitting strip, wherein at least the first light emitting strip comprises at least two contact stripes, wherein each of the contact stripes, at least partially, extends along a side of a substrate of the first light emitting strip in a length direction of the first light emitting strip, wherein at least one of the contact stripes is configured for mating or joining the first light emitting strip with the second light emitting strip; and mating or joining the first and second light emitting strips by means of the at least one of the contact stripes.

As discussed above, the invention is configured for providing connections between LED light emitting strips, which are invisible from outside when the LED light emitting strips are lighted. In this way, an arrangement of two or more LED light emitting strips can be manufactured such that connections between the two or more LED light emitting strips are invisible from outside when the LED light emitting strips are lighted. Therefore, the first and second light emitting strips are mated or joined by means of or with or by use of the at least one of the contact stripes Two or more LED light emitting strips may be arranged and mated or joined in any configuration of an arrangement, for example a configuration in T-form, L-form, V-form, Y-form, X-form, star form, Z-form or the like, wherein the mated or joined connections between individual light emitting strips are invisible from outside when the LED light emitting strips are lighted.

In a preferred embodiment, an end of the at least one of the contact stripes is formed female or socket shaped and is configured to accommodate an end of the second light emitting strip, wherein the step of mating or joining the first and second light emitting strips by means of the least one of the contact stripes comprises inserting the end of the second light emitting strip into the female or socket shaped end. In this way, the light emitting strips can be easily connected without a need for firmly bonding. However, alternatively or in addition, the ends of the light emitting strips may be firmly bonded, for example by soldiering, welding or adhesive bonding.

According to a preferred embodiment, the female or socket shaped end is configured to accommodate an end of at least one contact stripe of the second light emitting strip, wherein inserting the end of the second light emitting strip into the female or socket shaped end comprises inserting the end of the at least one contact stripe of the second light emitting strip into the female or socket shaped end. In this way, the contact stripes of the first light emitting strip are directly contacted to the contact stripes of the second light emitting strip.

According to another preferred embodiment, the female or socket shaped end is configured to accommodate an end of a substrate of the second light emitting strip, wherein inserting the end of the second light emitting strip into the female or socket shaped end comprises inserting the end of the substrate of the second light emitting strip into the female or socket shaped end. In this way, a connection between the contact stripes of the first light emitting strip and the substrate of the second light emitting strip is provided. A connection of the contact stripes of the first and the second light emitting strips can therefore be avoided.

According to a further aspect, the present invention provides an automotive lighting system which comprises a light emitting strip according to the invention or an arrangement of light emitting strips according to the invention or an arrangement of light emitting strips manufactured according to a method according to the invention.

The automotive lighting system may be configured for interior or exterior or interior and exterior vehicle lighting. An interior lighting system may e.g. be configured for ambient lighting. An exterior lighting system may comprise or be configured as an indicator, brake light, daytime running light or the like.

A control unit may be comprised in an independent lighting system to control the light emitting strips. Alternatively or in addition, a control unit may be implemented in a control system of a vehicle. In this case, the lighting system is configured to be connected to a control system of a vehicle.

The light emitting strip may be a so-called Chip-on-Board light emitting strip. A Chip-on-Board light emitting strip—or shortly COB light emitting strip—is manufactured by employing methods of directly mounting integrated circuits on substrates. This means that the single LED chips or LED die are mounted onto the substrate without using SMD technologies and preferably also without using printed boards, printed circuit boards (PCB) and the like. This means that the LED chips are not soldered onto a PCB. Generally, the chip-on-board technology is a process for the direct mounting of unpackaged semiconductor chips on suitable substrates to an electronic assembly. In the context of the present invention the term "chip" is to be understood as a non-packaged semiconductor device. An LED-chip is consequently one single LED die.

BRIEF DESCRIPTION OF THE DRAWINGS

For a more complete understanding of the invention and the advantages thereof, exemplary embodiments of the invention are explained in more detail in the following description with reference to the accompanying drawing figures, in which like reference characters designate like parts and in which.

The accompanying drawings are included to provide a further understanding of the present invention and are incorporated in and constitute a part of this specification. The drawings illustrate particular embodiments of the invention and together with the description serve to explain the principles of the invention. Other embodiments of the invention and many of the attendant advantages of the invention will be readily appreciated as they become better understood with reference to the following detailed description.

It will be appreciated that common and/or well understood elements that may be useful or necessary in a commercially feasible embodiment are not necessarily depicted in order to facilitate a more abstracted view of the embodiments. The elements of the drawings are not necessarily illustrated to scale relative to each other. It will further be appreciated that certain actions and/or steps in an embodiment of a method may be described or depicted in a particular order of occurrences while those skilled in the art will understand that such specificity with respect to sequence is not actually required. It will also be understood that the terms and expressions used in the present specification have the ordinary meaning as is accorded to such terms and expressions with respect to their corresponding respective areas of inquiry and study, except where specific meanings have otherwise been set forth herein.

DETAILED DESCRIPTION OF EMBODIMENTS

Figure 1:
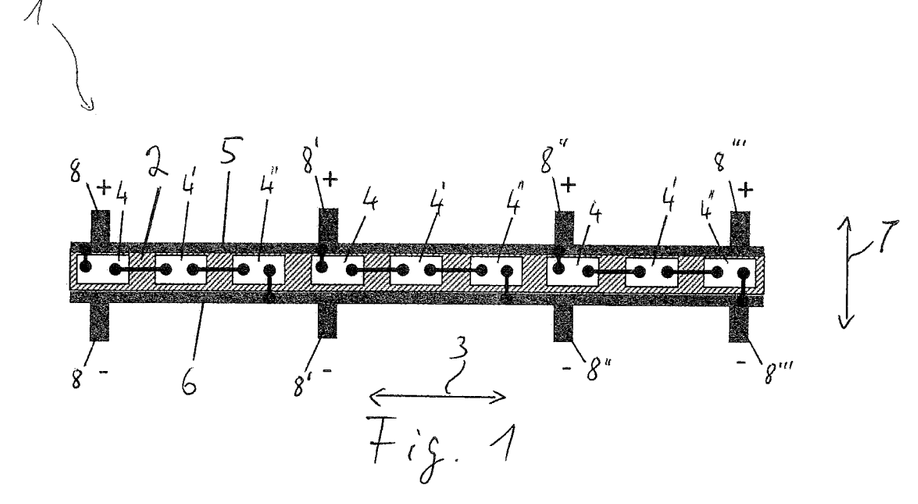
FIG. 1 is a schematic top view of an LED light emitting strip.

With reference firstly to FIG. 1 of the drawings, a top view of an LED light emitting strip 1 is illustrated schematically. In particular, a section of an LED light emitting strip 1 is shown. Therefore, the length of the LED light emitting strip 1 is not limited to the length as shown, but may have any desired extend.

The light emitting strip 1 includes a substrate 2, a plurality of LED chips 4 arranged on the substrate 2, a first contact stripe 5 and a second contact stripe 6.

The substrate 2 extends along a length direction 3 of the LED light emitting strip 1. In the embodiment shown in FIG. 1, the LED light emitting strip is a thin and long strip formed straight. However, the invention is not limited to such a straight configuration. A thin and long LED light emitting strip may also be formed bended or curved. In this case, the length direction changes as a function of the length of the strip.

The contact stripes 5, 6 supply the LED chips 4 arranged on the substrate 2 with electric energy in order to light the LED chips 4. Therefore, the contact stripes 5, 6 are isolated from each other.

The contact stripes 5, 6 both extend in the length direction 3 of the light emitting strip 1, each along a side of the substrate 2. For example only, the contact stripes 5, 6 are arranged on opposite sides of the substrate.

In the example shown, the substrate is formed of a transparent material, in particular the transparent polymer or resin.

Alternatively, the substrate may be formed integrally with one of the contact stripes 5, 6. According to such an integrated design of the substrate 2, it comprises a conductive metal, which preferably is configured plastically deformable. In this case, the metal surface of the substrate preferably is also configured with a high reflectance.

The LED chips 4 are arranged on the substrate 2 in a regular row along the length direction 3. In such a regular row, distances between the LED chips are preferably equal.

In order to supply the LED chips 4 with electric energy, the LED chips 4 are contacted to the contact stripes 5, 6 in a transverse direction 7. The transverse direction 7 is a direction normal or perpendicular to the length direction 3. Therefore, a wirebond directly connecting an LED chip 4 to one of the contact stripes 5, 6, is oriented in the transverse direction 7.

In other embodiments, however, the LED chips may also be contacted to the contact stripes 5, 6 in an oblique direction. In this case, the orientation of the contacts directly connecting an LED chip 4 to one of the contact stripes 5, 6 comprises a transverse direction component and a length direction component.

In the exemplary embodiment of FIG. 1, the LED chips 4, 4', 4" are, an example only, contacted in groups of respectively three LED chips. Furthermore, an example only, the LED light emitting strip 1 comprises nine LED chips arranged in a row, connected in three groups along the LED light emitting strip 1.

Each group comprises a first LED chip 4 connected to the first contact stripe 5 in the transverse direction 7, a second LED chip 4' arranged in the middle and contacted to the first LED chip 4 in length direction 3, and a third LED chip 4"

connected to the second LED chip 4' in length direction 3 and connected to the second contact stripe 6 in the transverse direction 7.

Each group is arranged on a part of the LED light emitting strip 1. The LED chips 4, 4', 4" of such a part or group are contacted with a section of the contact stripes 5, 6 in parallel to LED chips 4, 4', 4" of other groups connected to other sections of the contact stripes 5, 6. In this way, each group is directly supplied with electric energy from the contact stripes 5, 6.

In the exemplary embodiment of FIG. 1, the contact stripes 5, 6, are continuously extending along the sides of the substrate 2. Furthermore, the contact stripes 5, 6 each comprise a plurality of terminals 8 for additionally applying supply voltage to the LED chips 4. A first terminal 8 of a respective contact stripe 5, 6 is arranged at a first section of the contact stripes 5, 6. The first section is distinct from a second section of the contact stripes 5, 6 where a second terminal 8' is arranged.

As an example only, each of the contact stripes 5, 6 comprises four terminals 8, 8', 8", 8'". The terminals 8, 8', 8", 8'" are distributed along the respective contact stripe 5, 6 and in use directly apply supply voltage to the respective sections of the contact stripes 5, 6. In this way, a decrease of voltage over the length of the contact stripes 5, 6, which otherwise may arise through resistance heating, is prevented.

Additionally, the LED chips may be encapsulated in a transparent or partly transparent encapsulating layer, for example of silicone, epoxy resin or polymer. In case of a transparent substrate 2, the encapsulating layer may be formed integrally with the substrate 2 and protect the LED chips from humidity and mechanical impact. In this case, the substrate 2 and the contacts may be, at least in part, encapsulated or embedded in the encapsulant, too.

A lighting material, such as e.g. a fluorescent material, may be comprised in the encapsulating layer. Alternatively or in addition, a lighting material may be deposited on the transparent layer or directly on the LED chips.

In the exemplary embodiment of FIG. 1, the contact stripes 5, 6 extend along the complete length of the light emitting strip. However, the contact stripes 5, 6 may also only partially extent along the side of the substrate 2 in length direction 3.

Figure 2:
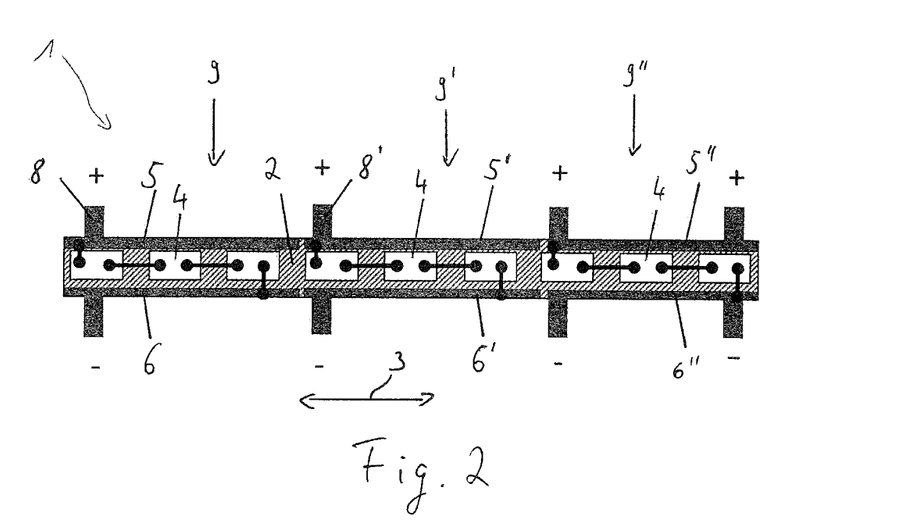
FIG. 2 is a schematic top view of an LED light emitting strip according to another embodiment.

With reference now also to FIG. 2 of the drawings, a schematic top view of an LED light emitting strip according to another embodiment is shown.

This embodiment differs from the embodiment of FIG. 1 in that a plurality of pairs of contact stripes 5', 6'; 5", 6" are provided in a row along the length direction. Each pair of contact stripes thereby corresponds to an individual segment 9, 9', 9" of the LED light emitting strip.

Each segment 9, 9', 9" comprises a group of LED chips 4 contacted to the contact stripes 5, 6; 5', 6'; 5", 6" of the corresponding pair. The respective pairs of contact stripes are isolated or distanced from each other and configured to supply the LED chips 4 of the respective group.

Each pair of contact stripes 5, 6; 5', 6'; 5", 6" is configured individually controllable to individually actuate or light the LED Chips of the corresponding segment 9, 9', 9" of the light emitting strip 1. This is realized in that the terminals corresponding to each pair of contact stripes are connected to an external control unit (not shown), which is configured to individually provide a suitable supply voltage and current for each terminal.

The LED light emitting strip and the control unit may be comprised in an independent lighting. Alternatively or in addition, a control unit may be implemented in a control system of a vehicle. In this case, the lighting system comprises the LED light emitting strip and is configured to be connected to a control system of a vehicle.

Such a lighting system may comprise an arrangement of at least two LED light emitting strips.

Figure 3:
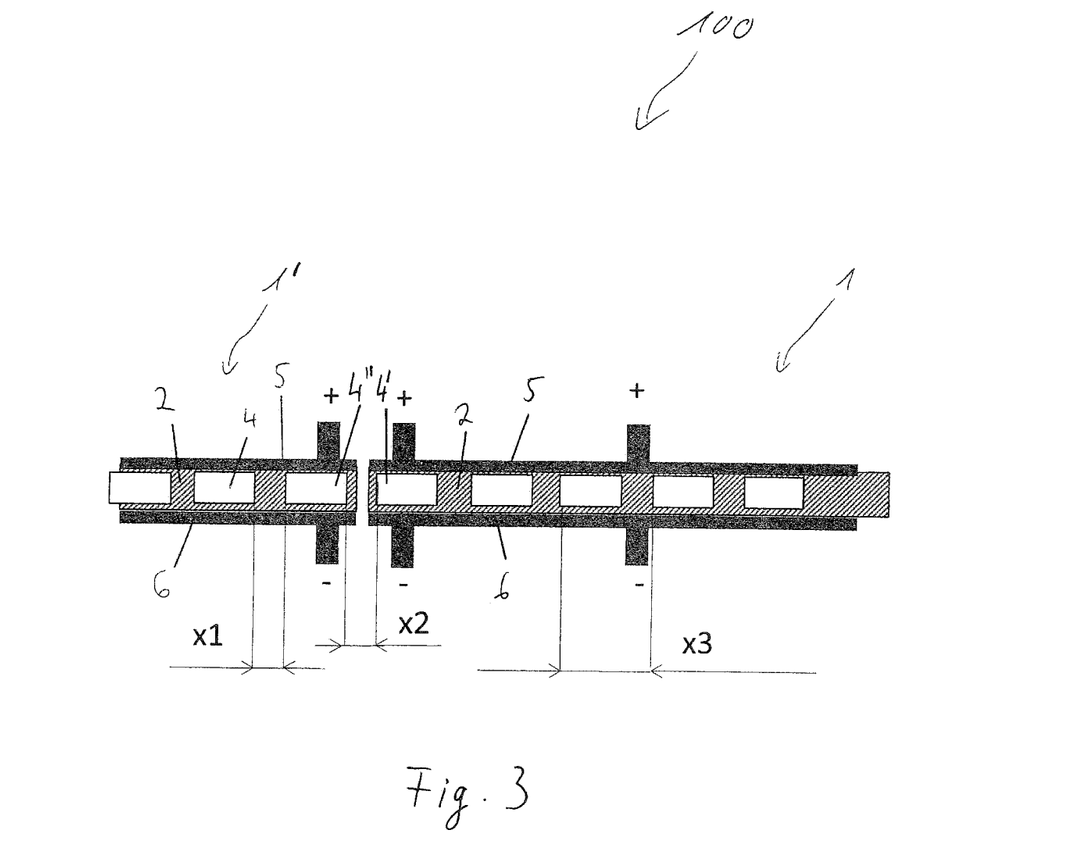
FIG. 3 is a schematic top view of an arrangement of LED light emitting strips.

With reference now also to FIG. 3 of the drawings, a schematic top view of an arrangement 100 of LED light emitting strips 1, 1' is shown.

As an example only, the first and second LED light emitting strips 1, 1' are configured according to FIG. 1. They are shown in a section, which is near a connection region where the first and second LED light emitting strips 1 and 1' are mated or joined. Furthermore, for a better overview only, the contacts of the LED chips 4 are hidden in FIG. 3.

An end of the first light emitting strip 1 is mated or joined with an end of the second light emitting strip 1'. The connection between the mated or joined light emitting strips 1, 1' can be realized in various ways. The connection may be realized for example by means of a bracket, a connector, or by means of firmly bonding the light emitting strips, for example by soldering, welding or adhesive bonding.

In particular, at least one of the contact stripes 5, 6 may be configured to connect the light emitting strips, which will be explained in more detail with respect to FIGS. 4 and 5.

A gap between the first and second LED light emitting strips 1, 1' may be free in the air (filled with air) or filled with any light transmitting material, such as glass, a transparent polymer, transparent epoxy resin or transparent ceramic.

The LED chips 4 are arranged in a regular row with a predetermined distance between them, which is a first distance x1. The first and second light emitting strips are mated or joined with each other in a butt configuration, wherein a second distance x2 is provided between a last LED chip 4' of the row of the first light emitting strip 1 and a first LED chip 4" of the row of the second light emitting strip 1'.

The second distance is adapted to the first distance. Thus, the LED light emitting strips 1, 1' are connected to each other with a connection invisible from outside, when the LED light emitting strips are lighted.

In the exemplary embodiment shown, the first length x1 is equal to the second length x2. In other embodiments, deviations are possible. A length of the second distance x2 thus is preferably at least 90% of a length of the first distance x1 and the second distance x2 is equal to or less than the sum x3 of the first distance x1 and the length of one LED chip 4. This results in a deviation or difference between the first and second distances, which is hardly recognizable from outside.

Figure 4:
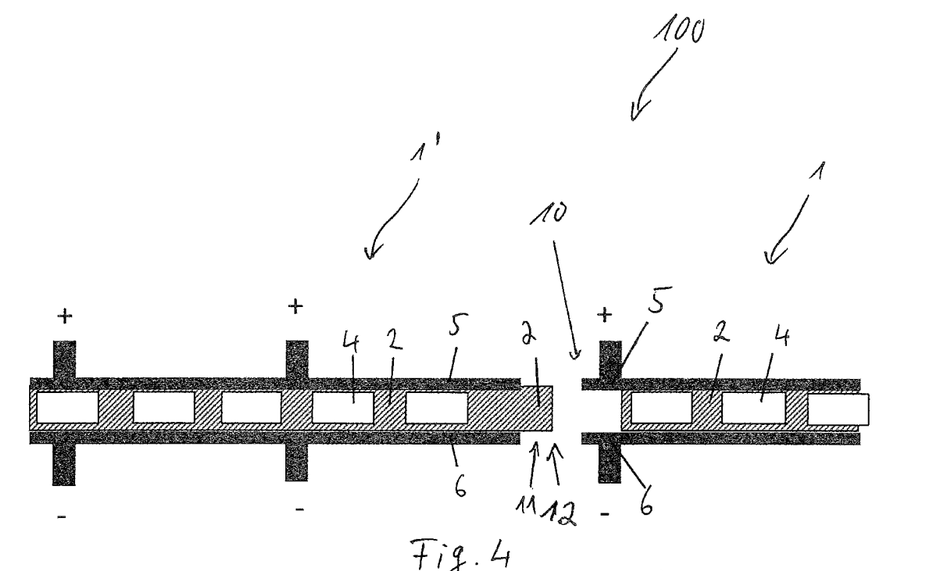
FIG. 4 is a schematic top view of an arrangement of LED light emitting strips according to another embodiment.

With reference now also to FIG. 4 of the drawings, a schematic top view of an arrangement of LED light emitting strips 1, 1' according to another embodiment is shown.

According to this embodiment, an end 10 of the contact stripes 5, 6 is formed female or socket shaped. This is realized, in that the end 10 of the contact stripes 5, 6 respectively extends over the corresponding end of the substrate 2 of the light emitting strip 1. In this way, the end 10 of the contact stripes 5, 6 is configured to accommodate an end 12 of the substrate 2 of the second light emitting strip 1' extending from an end 11 of the second light emitting strip 1'.

The end 10 of the contact stripes 5, 6 is formed to enclose the end 12 of the substrate 2 of the second light emitting strip 1'. The light emitting strips 1, 1' thus can be connected to each other by inserting the end 12 of the substrate 2 of the second light emitting strip 1' into the female or socket shaped end 10.

Figure 5:
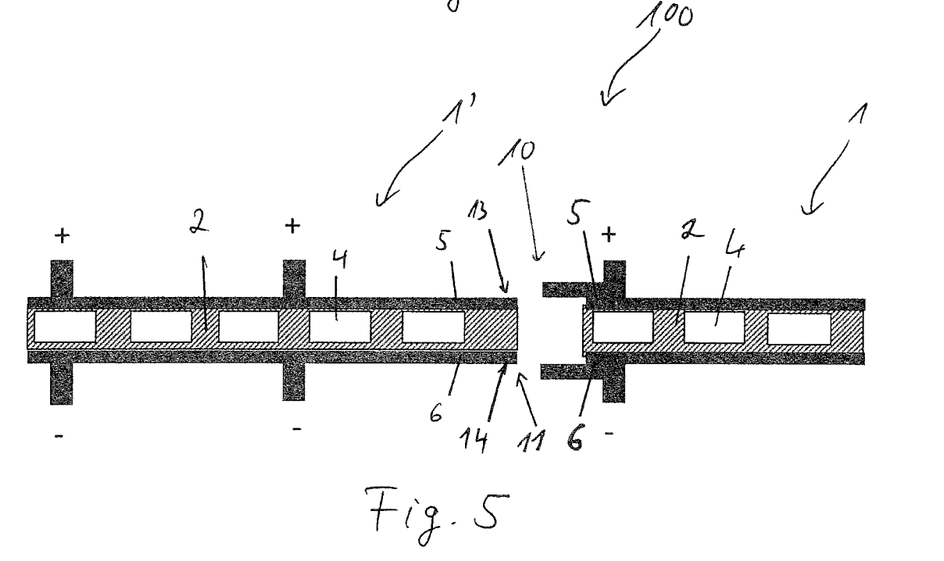
FIG. 5 is a schematic top view of an arrangement of LED light emitting strips according to yet another embodiment.

Finally, referring to FIG. 5 of the drawings, a schematic top view of an arrangement of LED light emitting strips according to yet another embodiment is shown.

According to this embodiment, an end 10 of the contact stripes 5, 6 is also formed female or socket shaped. However, in contrast to FIG. 4, this is realized, in that the end 10 of the contact stripes 5, 6 respectively is widened in the transverse direction 7. The end 10 of the contact stripes 5, thus extends over the corresponding end of the substrate 2 of the light emitting strip 1 in a widened manner. In this way, the end 10 of the contact stripes 5, 6 is configured to accommodate the complete end 11 of the second light emitting strip 1' including the ends 13 and 14 of the contact stripes 5, 6 thereof. The ends 13 and 14 thus can be directly connected mechanically and electrically to the contact stripes 5, 6 of the first light emitting strip 1.

The light emitting strips 1, 1' thus can be connected mechanically and electrically to each other by inserting the ends 13, 14 of the contact stripes 5, 6 of the second light emitting strip 1' into the female or socket shaped end 10.

Although specific embodiments of the invention are illustrated and described herein, it will be appreciated by those of ordinary skill in the art that a variety of alternate and/or equivalent implementations exist. It should be appreciated that the exemplary embodiment or exemplary embodiments are examples only and are not intended to limit the scope, applicability, or configuration in any way.

Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

It will also be appreciated that in this document the terms "comprise", "comprising", "include", "including", "contain", "containing", "have", "having", and any variations thereof, are intended to be understood in an inclusive (i.e. non-exclusive) sense, such that the process, method, device, apparatus or system described herein is not limited to those features or parts or elements or steps recited but may include other elements, features, parts or steps not expressly listed or inherent to such process, method, article, or apparatus. Furthermore, the terms "a" and "an" used herein are intended to be understood as meaning one or more unless explicitly stated otherwise. Moreover, the terms "first", "second", "third", etc. are used merely as labels, and are not intended to impose numerical requirements on or to establish a certain ranking of importance of their objects.

PREFERRED EMBODIMENTS

1. LED light emitting strip (1), in particular for an automotive lighting system, comprising:
   a substrate (2) extending along a length direction (3) of the strip;
   a plurality of LED chips (4) arranged on or in the substrate (2), wherein the LED chips (4) are arranged in at least one row along the length direction (3);
   at least two contact stripes (5, 6) configured to supply the LED chips (4) with electric energy,
   wherein each of the contact stripes (5, 6) individually extends, at least partially, along a side of the substrate (2) in the length direction (3), and
   wherein the LED chips (4) are contacted to the contact stripes (5, 6) at least partially in a transverse or oblique direction (7) of the strip (1).
2. Light emitting strip according to embodiment 1, wherein a surface of the substrate (2) is configured with a high reflectance.
3. Light emitting strip according to embodiment 1 or 2, wherein the substrate (2) is configured plastically deformable.
4. Light emitting strip according to any one of the preceding embodiments, wherein the substrate (2) comprises a metal.
5. Light emitting strip according to embodiment 4, wherein the substrate (2) is formed integral with at least one of the contact stripes (5; 6).
6. Light emitting strip according to any one of the preceding embodiments, wherein the at least two contact stripes (5, 6) each comprise a plurality of, in particular at least two, terminals (8) for additionally applying supply voltage to the LED chips (4).
7. Light emitting strip according to embodiment 6, wherein a first terminal (8') of a respective contact stripe (5) is arranged at a section of the contact stripe (5) distinct from the section of a second terminal (8").
8. Light emitting strip according to any one of the preceding embodiments, wherein at least one of the contact stripes (5, 6) is configured for mating or joining the light emitting strip (1) with another light emitting strip (1').
9. Light emitting strip according to embodiment 8, wherein an end (10) of at least one of the contact stripes (5, 6) is formed female or socket shaped and is configured to accommodate an end (11) of the other light emitting strip (1') or to accommodate an end (13; 14) of at least one of the contact stripes (5, 6) of the other light emitting strip (1') or to accommodate an end (12) of the substrate (2) of the of the other light emitting strip (1').
10. Light emitting strip according to any one of the preceding embodiments, wherein the LED chips (4) of at least one part of the light emitting strip (1) are contacted with the contact strips (5, 6; 5', 6'; 5", 6") in parallel to LED chips (4) of at least one other part of the light emitting strip (1).
11. Light emitting strip according to any one of the preceding embodiments, wherein a plurality of pairs of contact stripes (5, 6, 5', 6', 5", 6") are provided in a row along the length direction (3) such that each pair of contact stripes (5, 6, 5', 6', 5", 6") corresponds to an individual segment (9, 9', 9") of the light emitting strip.
12. Light emitting strip according to embodiment 11, wherein the respective pairs of contact stripes (5, 6, 5', 6', 5", 6") are isolated or distanced from each other and each pair of contact stripes (5, 6; 5', 6'; 5", 6") is configured to supply LED chips (4) of the corresponding segment (9; 9'; 9") of the light emitting strip (1).
13. Light emitting strip according to embodiment 11 or 12, wherein each pair of contact stripes (5, 6; 5', 6'; 5", 6") is configured individually controllable to individually actuate or light the corresponding segment (9; 9'; 9") of the light emitting strip (1).
14. Light emitting strip according to any one of the preceding embodiments, wherein the LED chips (4) arranged in the at least one row are positioned apart from each other with a predetermined distance (x1).
15. An arrangement (100) of light emitting strips (1, 1'), comprising:
    a first light emitting strip (1) and a second light emitting strip (1'), wherein at least one of the first and second light emitting strips (1; 1') is configured as light emitting strip according to one of embodiments 1 to 14, and wherein the first and second light emitting strips (1; 1') are mated or joined with each other.
16. The arrangement according to embodiment 15, wherein an end (10) of the first light emitting strip (1) is mated or joined with an end (11) of the second light emitting strip (1').
17. An arrangement (100) of light emitting strips (1; 1'), comprising:
a first light emitting strip (1) and a second light emitting strip (1'), wherein at least one of the first and second light emitting strips (1; 1') is configured as light emitting strip according to embodiment 14, wherein the predetermined distance (x1) between the LED chips (4) arranged in the at least one row is a first distance,
wherein the first and second light emitting strips (1; 1') are mated or joined with each other, and
wherein a second distance (x2) between a last LED chip (4') of a row of the first light emitting strip (1) and a first LED chip (4") of a row of the second light emitting strip (1') is provided adapted to the first distance.
18. The arrangement according to embodiment 17, wherein a length of the second distance (x2) is at least 90% of a length of the first distance (x1).
19. The arrangement according to embodiment 17 or 18, wherein the LED chips (4) have a uniform length, and wherein the second distance (x2) is equal to or less than the sum (x3) of the length of the first distance (x1) and the length of one LED chip (4).
20. Method of manufacturing an arrangement of light emitting strips, in particular an arrangement of light emitting strips according to any one of embodiments 15 to 19, comprising the steps of:
positioning a first light emitting strip (1) relative to a second light emitting strip (1'), wherein at least the first light emitting strip (1) comprises at least two contact stripes (5, 6),
wherein each of the contact stripes (5, 6), at least partially, extends along a side of a substrate (2) of the first light emitting strip in a length direction (3) of the first light emitting strip (1), wherein at least one of the contact stripes (5, 6) is configured for mating or joining the first light emitting strip (1) with the second light emitting strip (1'); and
mating or joining the first and second light emitting strips (1; 1') by means of the at least one of the contact stripes (5, 6).
21. Method according to embodiment 20, wherein an end (10) of the at least one of the contact stripes (5, 6) is formed female or socket shaped and is configured to accommodate an end (11) of the second light emitting strip (1'), wherein the step of mating or joining the first and second light emitting strips (1; 1') by means of the least one of the contact stripes (5, 6) comprises inserting the end (11) of the second light emitting strip (1') into the female or socket shaped end (10).
22. Method according to embodiment 21, wherein the female or socket shaped end (10) is configured to accommodate an end (13, 14) of at least one contact stripe of the second light emitting strip (1'), wherein inserting the end (11) of the second light emitting strip (1') into the female or socket shaped end (10) comprises inserting the end (13, 14) of the at least one contact stripe of the second light emitting strip (1') into the female or socket shaped end (10).

23. Method according to embodiment 21, wherein the female or socket shaped end (10) is configured to accommodate an end (12) of a substrate (2) of the second light emitting strip (1'), inserting the end (11) of the second light emitting strip (1') into the female or socket shaped end (10) comprises inserting the end (12) of the substrate (2) of the second light emitting strip (1') into the female or socket shaped end (10).
24. An automotive lighting system which comprises a light emitting strip (1) according to any one of embodiments 1 to 14 or an arrangement (100) of light emitting strips according to any one of embodiments 15 to 19 or an arrangement of light emitting strips manufactured according to a method of any one of embodiments 20 to 23.

The invention claimed is:
1. A LED light emitting strip for an automotive lighting system, comprising:
a substrate extending along a length direction of the strip;
a plurality of LED chips arranged on or in the substrate, wherein the LED chips are arranged in at least one row along the length direction;
at least two contact stripes configured to supply the LED chips with electric energy,
wherein each of the contact stripes individually extends, at least partially, along a side of the substrate in the length direction, and
wherein the LED chips are contacted to the contact stripes at least partially in a transverse or oblique direction of the strip,
wherein a plurality of pairs of contact stripes are provided in a row along the length direction such that each pair of contact stripes corresponds to an individual segment of the light emitting strip, and
wherein each pair of contact stripes is configured individually controllable to individually actuate or light the corresponding segment of the light emitting strip.
2. The light emitting strip of claim 1, wherein the substrate is configured plastically deformable.
3. The light emitting strip of claim 1, wherein the substrate comprises a metal.
4. The light emitting strip of claim 3, wherein the substrate is formed integral with at least one of the contact stripes.
5. The light emitting strip of claim 1, wherein the at least two contact stripes each comprise a plurality of terminals for additionally applying supply voltage to the LED chips.
6. The light emitting strip of claim 5, wherein a first terminal of a respective contact stripe is arranged at a section of the contact stripe distinct from the section of a second terminal.
7. The light emitting strip of claim 1, wherein at least one of the contact stripes is configured for mating or joining the light emitting strip with another light emitting strip.
8. The light emitting strip of claim 7, wherein an end of at least one of the contact stripes is formed female or socket shaped and is configured to accommodate an end of the other light emitting strip or to accommodate an end of at least one of the contact stripes of the other light emitting strip or to accommodate an end of the substrate of the other light emitting strip.
9. The light emitting strip of claim 1, wherein the LED chips of at least one segment of the light emitting strip are contacted with the contact strips in parallel to LED chips of at least one other segment of the light emitting strip.
10. The light emitting strip of claim 1, wherein the respective pairs of contact stripes are isolated or distanced from each other and each pair of contact stripes is configured to supply LED chips of the corresponding segment of the light emitting strip.

11. The light emitting strip of claim 1, wherein the LED chips arranged in the at least one row are positioned apart from each other with a predetermined distance.

12. An arrangement of light emitting strips for an automotive lighting system, comprising:
a first light emitting strip and a second light emitting strip, wherein at least one of the first and second light emitting strips is configured as light emitting strip according to claim 11,
wherein the predetermined distance between the LED chips arranged in the at least one row is a first distance,
wherein the first and second light emitting strips are mated or joined with each other, and
wherein a second distance between a last LED chip of a row of the first light emitting strip and a first LED chip of a row of the second light emitting strip is provided adapted to the first distance.

13. Arrangement of claim 12, wherein a length of the second distance is at least 90% of a length of the first distance.

14. Arrangement of claim 12, wherein the LED chips have a uniform length, and wherein the second distance is equal to or less than the sum of the first distance and the length of one LED chip.

15. An arrangement of light emitting strips for an automotive lighting system, comprising:
a first light emitting strip and a second light emitting strip, wherein at least one of the first and second light emitting strips is configured as light emitting strip according to claim 1, and
wherein the first and second light emitting strips are mated or joined with each other.

16. Arrangement of claim 15, wherein an end of the first light emitting strip is mated or joined with an end of the second light emitting strip.

17. An automotive lighting system which comprises a light emitting strip according to claim 1.

18. The light emitting strip of claim 1, wherein the light emitting strip is a Chip-on-Board light emitting strip.

19. A method of manufacturing an arrangement of light emitting strips for an automotive lighting system, comprising the steps of:
positioning a first light emitting strip relative to a second light emitting strip, wherein at least the first light emitting strip comprises at least two contact stripes, wherein a plurality of pairs of contact strips, are provided in a row along the length direction such that each pair of contact stripes corresponds to an individual segment of the light emitting strip, wherein each pair of contact stripes is configured individually controllable to individually actuate or light the corresponding segment of the light emitting strip;
wherein each of the contact stripes, at least partially, extends along a side of a substrate of the first light emitting strip in a length direction of the first light emitting strip, wherein at least one of the contact stripes is configured for mating or joining the first light emitting strip with the second light emitting strip; and
mating or joining the first and second light emitting strips by means of the at least one of the contact stripes.

20. The method of claim 19, wherein an end of the at least one of the contact stripes is formed female or socket shaped and is configured to accommodate an end of the second light emitting strip, wherein the step of mating or joining the first and second light emitting strips by means of the least one of the contact stripes comprises inserting the end of the second light emitting strip into the female or socket shaped end.

21. The method of claim 20, wherein the female or socket shaped end is configured to accommodate an end of at least one contact stripe of the second light emitting strip, wherein inserting the end of the second light emitting strip into the female or socket shaped end comprises inserting the end of the at least one contact stripe of the second light emitting strip into the female or socket shaped end.

22. The method of claim 20, wherein the female or socket shaped end is configured to accommodate an end of a substrate of the second light emitting strip, wherein inserting the end of the second light emitting strip into the female or socket shaped end comprises inserting the end of the substrate of the second light emitting strip into the female or socket shaped end.

* * * * *